(12) United States Patent
Matsumoto et al.

(10) Patent No.: US 8,138,445 B2
(45) Date of Patent: Mar. 20, 2012

(54) PLASMA PROCESSING APPARATUS AND PLASMA PROCESSING METHOD

(75) Inventors: Naoki Matsumoto, Amagasaki (JP); Chishio Koshimizu, Nirasaki (JP); Yoshinobu Hayakawa, Nirasaki (JP); Hidetoshi Hanaoka, Nirasaki (JP); Manabu Iwata, Nirasaki (JP); Satoshi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1388 days.

(21) Appl. No.: 11/694,153

(22) Filed: Mar. 30, 2007

(65) Prior Publication Data
US 2007/0235426 A1 Oct. 11, 2007

Related U.S. Application Data

(60) Provisional application No. 60/791,461, filed on Apr. 13, 2006.

(30) Foreign Application Priority Data

Mar. 30, 2006 (JP) ................................. 2006-092908

(51) Int. Cl.
*B23K 10/00* (2006.01)
(52) U.S. Cl. .......... 219/121.42; 219/121.43; 156/345.44
(58) Field of Classification Search ................ 219/121.4, 219/121.41, 121.43, 121.54, 121.57; 118/723 R, 118/723 I; 312/111.51; 156/345.47, 345.48
See application file for complete search history.

(56) References Cited

U.S. PATENT DOCUMENTS

| | | | | |
|---|---|---|---|---|
| 4,131,533 | A | * | 12/1978 | Bialko et al. ............. 204/298.14 |
| 6,462,482 | B1 | * | 10/2002 | Wickramanayaka et al. ........................ 315/111.21 |
| 6,642,149 | B2 | | 11/2003 | Suemasa et al. |
| 6,649,954 | B2 | * | 11/2003 | Cross ............................ 257/295 |
| 2003/0037881 | A1 | * | 2/2003 | Barnes et al. ............. 156/345.44 |
| 2004/0192056 | A1 | * | 9/2004 | Iijima et al. ................... 438/706 |
| 2006/0037703 | A1 | | 2/2006 | Koshiishi et al. |
| 2006/0037704 | A1 | | 2/2006 | Iwata et al. |

FOREIGN PATENT DOCUMENTS

JP 2000-156370 6/2000
WO WO 03/003405 A1 1/2003
* cited by examiner

*Primary Examiner* — Mark Paschall
(74) *Attorney, Agent, or Firm* — Oblon, Spivak, McClelland, Maier & Neustadt, L.L.P.

(57) ABSTRACT

In a plasma processing apparatus, a first electrode is attached to a grounded evacuable processing chamber via an insulating material or a space and a second electrode disposed in parallel with the first electrode spaced apart therefrom in the processing chamber, the second electrode supporting a target substrate to face the first electrode. A first radio frequency power supply unit applies a first radio frequency power of a first frequency to the second electrode, and a second radio frequency power supply unit applies a second radio frequency power of a second frequency lower than the first frequency to the second electrode. Further, a processing gas supply unit supplies a processing gas to a processing space formed by the first and the second electrode and a sidewall of the processing chamber. Moreover, an inductor electrically is connected between the first electrode and a ground potential.

15 Claims, 12 Drawing Sheets

PLASMA PROCESSING APPARATUS AND PLASMA PROCESSING METHOD

FIELD OF THE INVENTION

The present invention relates to a technique for performing a plasma processing on a target substrate; and, more particularly, to a capacitively coupled plasma processing apparatus of a dual frequency application mode and a plasma processing method.

BACKGROUND OF THE INVENTION

In a manufacturing process of semiconductor devices or flat panel displays (FPDs), a plasma is used to perform a processing, such as etching, deposition, oxidation, sputtering or the like, so as to obtain a good reaction of a processing gas at a relatively low temperature. Conventionally, a capacitively coupled type plasma apparatus has been widely employed as a single-wafer plasma processing apparatus, especially, as a single-wafer plasma etching apparatus.

Generally, in the capacitively coupled plasma processing apparatus, an upper electrode and a lower electrode are disposed to face each other in parallel in a vacuum processing chamber, a substrate to be processed (a semiconductor wafer, a glass substrate or the like) is mounted on the upper electrode, and a radio frequency voltage is applied to either one of the upper and the lower electrode. Electrons are accelerated by an electric field formed by the radio frequency voltage to collide with a processing gas. As a result of ionization by the collision between the electrons and the processing gas, a plasma is generated, and a desired microprocessing (for example, etching) is performed on the surface of the substrate by radicals or ions in the plasma. At this time, the electrode to which the radio frequency voltage is applied is connected with a radio frequency power supply via a blocking capacitor in a matching unit and thus serves as a cathode. A cathode coupling method in which the radio frequency voltage is applied to the lower electrode, serving as the cathode, for supporting the substrate enables an anisotropic etching by substantially vertically attracting ions in the plasma to the substrate with a self-bias voltage generated in the lower electrode.

In the capacitively coupled plasma processing apparatus of the dual frequency application type, a first radio frequency power of a relatively radio frequency (generally, 27 MHz or greater) for plasma generation and a second radio frequency power of a relatively low frequency (generally, 13.56 MHz or less) for ion attraction are applied to the lower electrode (see, e.g., Japanese Patent Laid-open Publication No. 2000-156370 and U.S. Pat. No. 6,642,149).

The dual frequency application is advantageous in that plasma density and anisotropic etching selectivity can be individually optimized by the first and the second radio frequency power, and also in that the second radio frequency power of a relatively low frequency can effectively prevent or suppress a deposit adhesion during a process in which deposits such as polymer and the like are adhered to an upper electrode. Specifically, when the ions are incident on the upper electrode serving as an anode, a deposited film (and an oxide film, if it exists) adhered to the electrode is sputtered by ion impact. The number of ions used for the sputtering is determined by the first radio frequency. Further, an electric field that accelerates the ions is generated by the second radio frequency power of the relatively low frequency.

In the conventional capacitively coupled plasma processing apparatus of the dual frequency application type as described above, the upper electrode serving as the anode to which no radio frequency is applied is DC-grounded generally. Typically, a processing chamber, which is frame grounded, is formed of metal, e.g., aluminum, a stainless steel or the like, so that the upper electrode can be held at ground potential via the processing chamber. Accordingly, the upper electrode is directly attached to a ceiling of the processing chamber to be integrally assembled thereto or the ceiling of the processing chamber itself is used as the upper electrode.

With a recent trend of miniaturization of design rules for the manufacturing process, a high-density plasma is required to be available at a low pressure for a plasma processing. In the capacitively coupled plasma processing apparatus in which dual frequency powers are applied to the lower electrode, the frequency of the first radio frequency power, which mainly contributes to a plasma generation, tends to be gradually increased and a frequency of 40 MHz or greater is standardly used in recent years. However, if the frequency of the radio frequency power becomes high, a radio frequency current is made to be concentrated on a central portion of the electrode, so that a density of a plasma generated in a processing space between two electrodes becomes higher at the central portion of the electrode than that at the edge portion thereof. As a result, there occurs a problem that process characteristics become nonuniform in a radial direction. Meanwhile, since the frequency of the second frequency power that mainly contributes to ion attraction is relatively low, it is not focused on the central portion of the electrode. In other words, in the conventional apparatus in which the upper electrode is directly attached to or formed integral with the processing chamber to be DC-grounded therethrough, the functions of the second radio frequency power that include attracting the ions toward the substrate and suppressing the deposit adhesion to the upper electrode are not deteriorated.

SUMMARY OF THE INVENTION

It is, therefore, an object of the present invention to provide a capacitively coupled plasma processing apparatus and method of a dual frequency application type in which two kinds of radio frequency powers are applied to an electrode for supporting a target substrate thereon, wherein in-surface uniformity of processes can be improved by controlling plasma density spatial distribution characteristics while preventing or suppressing an undesired film from being formed on another electrode facing the electrode for supporting the target substrate.

In accordance with a first aspect of the invention, there is provided a plasma processing apparatus including: an evacuable processing chamber which is grounded; a first electrode attached to the processing chamber via an insulating material or a space; a second electrode disposed in parallel with the first electrode spaced apart therefrom in the processing chamber, the second electrode supporting a target substrate to face the first electrode; a first radio frequency power supply unit for applying a first radio frequency power of a first frequency to the second electrode; a second radio frequency power supply unit for applying a second radio frequency power of a second frequency lower than the first frequency to the second electrode; a processing gas supply unit for supplying a processing gas to a processing space formed by the first and the second electrode and a sidewall of the processing chamber; and an inductor electrically connected between the first electrode and a ground potential.

In accordance with a second aspect of the invention, there is provided a plasma processing method including the steps of: disposing a first and a second electrode in parallel with a gap present therebetween in an evacuable processing chamber which is grounded; connecting the first electrode with a ground potential via a capacitive member and an inductive member, both being electrically arranged in parallel; supporting a target substrate on the second electrode to face the first electrode; vacuum exhausting an inside of the processing chamber to a specific pressure level; and supplying a processing gas into a processing space defined by the first and the second electrode and a sidewall of the processing chamber while applying to the second electrode a first radio frequency power of a first frequency and a second radio frequency power of a second frequency lower than the first frequency, thereby generating a plasma from the processing gas in the processing space and performing a specified process on the target substrate by using the plasma, wherein in frequency-impedance characteristics of a radio frequency transmission line from a boundary surface between the processing space and the first electrode to the ground potential via the first electrode, the frequency-impedance characteristics are set to make an impedance corresponding to the second frequency lower than that corresponding to the first frequency.

In the capacitively coupled plasma etching apparatus and method in accordance with the first and second aspects of the present invention, when the first radio frequency power from the first radio frequency power supply is applied to the second electrode, the plasma of the processing gas is generated in the processing space by a radio frequency discharge between the first and the second electrode and that between the second electrode and the sidewall (inner wall) of the processing chamber. Next, the plasma thus generated is diffused in all directions, especially in upward and outwardly radial directions, so that an electron current in the plasma flows to the ground via the first electrode, the sidewall of the processing chamber and the like. When the second radio frequency power from the second radio frequency power supply is applied to the second electrode, ions in the plasma which vibrate according to the second radio frequency are attracted into the substrate due to a self-bias voltage generated in the second electrode. Also, the ions are incident on the first electrode to sputter a surface thereof and removing a deposited film and the like therefrom, if they exist.

In accordance with the first and second aspects of the present invention, the first electrode is attached to the processing chamber at a ground potential via an insulator or a space and is connected with the ground potential via an inductive member or an inductor. Accordingly, an equivalent circuit in a radio frequency transmission line from a boundary surface between the processing space and the first electrode to the ground potential via the first electrode becomes a parallel LC circuit in which a coil component of an inductor is connected with a capacitive component of an insulator in parallel.

Generally, an impedance in the parallel LC circuit increases at a specific frequency (antiresonacne frequency) while it considerably decreases at a frequency away from the antiresonance frequency. By utilizing those characteristics, in the plasma processing apparatus of the first aspect of the present invention, it is possible to provide a high impedance at the first radio frequency and a low impedance at the second radio frequency. In accordance with an embodiment of the present invention, the antiresonance frequency is obtained within a range from about 5 MHz to about 200 MHz in the frequency-impedance characteristics in the above equivalent circuit or parallel LC circuit.

Due to the high impedance at the first radio frequency, the first radio frequency current hardly flows from the second electrode to the first electrode. Accordingly, there is relatively increased a portion of an electron current in the plasma flowing in the sidewall of the processing chamber, which makes the plasma density widen in the outwardly radial directions. In this way, by optimally increasing the impedance at the first radio frequency in the parallel LC circuit, plasma density spatial distribution characteristics can be controlled to be uniform diametrically. Meanwhile, by decreasing the impedance at the second radio frequency in the parallel LC circuit, the ions in the plasma which vibrate according to the second radio frequency are incident onto the first electrode with a strong impact. As a result, an undesired film adhered to a surface thereof can be effectively sputtered (removed) therefrom.

In accordance with a third aspect of the invention, there is provided a plasma processing apparatus including: an evacuable processing chamber which is grounded; a first electrode attached to the processing chamber via an insulating material or a space; a second electrode disposed in parallel with the first electrode spaced apart therefrom in the processing chamber, the second electrode supporting a target substrate to face the first electrode; a first radio frequency power supply unit for applying a first radio frequency power of a first frequency to the second electrode; a second radio frequency power supply unit for applying a second radio frequency power of a second frequency lower than the first frequency to the second electrode; a processing gas supply unit for supplying a processing gas to a processing space formed by the first and the second electrode and a sidewall of the processing chamber; and an inductor and a capacitor electrically connected in series between the first electrode and a ground potential.

In accordance with a fourth aspect of the invention, there is provided a plasma processing method including the steps of: disposing a first and a second electrode in parallel with a gap present therebetween in a vacuum evacuable processing chamber which is grounded; connecting the first electrode with a ground potential via a capacitive member and an inductive member, both being electrically arranged in serial-parallel therewith; supporting a target substrate on the second electrode to face the first electrode; vacuum exhausting an inside of the processing chamber to a specific pressure level; supplying a processing gas into a processing space defined by the first and the second electrode and a sidewall of the processing chamber while applying to the second electrode a first radio frequency power of a first frequency and a second radio frequency power of a second frequency lower than the first frequency, thereby generating a plasma from the processing gas in the processing space and performing a specified process on the target substrate by using the plasma, wherein in frequency-impedance characteristics of a radio frequency transmission line from a boundary surface between the processing space and the first electrode to the ground potential via the first electrode, the frequency-impedance characteristics are set to make an impedance corresponding to the second frequency lower than that corresponding to the first frequency.

In the third and the fourth aspect of the present invention, an equivalent circuit in a radio frequency transmission line from the boundary surface between the processing space and the first electrode to the ground potential via the first electrode is configured as a serial-parallel LC circuit. In this serial-parallel LC circuit, an impedance extremely decreases at a specific frequency (resonance frequency) and extremely increases at another specific frequency (antiresonance frequency). By utilizing those characteristics, a high impedance and a low impedance can be obtained at the first and the second radio frequency, respectively. In accordance with an embodiment of the present invention, the resonance frequency is obtained within a range from about 0.1 kHz to about 15 MHz and the antiresonance frequency is obtained within a range from about 5 MHz to about 200 MHz in the frequency-impedance characteristics of the equivalent circuit or the serial-parallel LC circuit. By optimally increasing the impedance at the first radio frequency in the serial-parallel LC circuit, plasma density spatial distribution characteristics can be controlled to be uniform diametrically. Further, by decreasing the impedance at the second radio frequency in the serial-parallel LC circuit substantially to a level at which a short-circuit occurs, the sputtering effect of removing an undesired film from the surface of the first electrode can be further enhanced.

In accordance with a fifth aspect of the invention, there is provided a plasma processing apparatus including: an evacuable processing chamber which is grounded; a first electrode attached to the processing chamber via an insulating material or a space; a second electrode disposed in parallel with the first electrode space apart therefrom in the processing chamber, the second electrode supporting a target substrate to face the first electrode; a first radio frequency power supply unit for applying a first radio frequency power of a first frequency to the second electrode; a second radio frequency power supply unit for applying a second radio frequency power of a second frequency lower than the first frequency to the second electrode; a processing gas supply unit for supplying a processing gas to a processing space formed by the first and the second electrode and a sidewall of the processing chamber; a DC power supply for applying a DC voltage to the first electrode; and a filter electrically connected between the first electrode and the DC power supply, the filter allowing a direct current to substantially pass therethrough while having desired frequency-impedance characteristics for a radio frequency.

In the plasma processing apparatus in accordance with the fifth aspect of the present invention, since a desired DC voltage is applied from the DC power supply to the first electrode via the filter to obtain acting effects thereby. Further, the functions of the first and the second radio frequency can be corrected, controlled or assisted by the frequency-impedance characteristics of the filter. For example, when the filter is provided in the serial-parallel LC circuit as in the second plasma processing apparatus, it is possible to improve the plasma density spatial distribution characteristics or the sputtering effect for the first electrode (which removes an undesired film therefrom).

In accordance with the plasma processing apparatus and the plasma processing method of the present invention, it is possible to resolve a tradeoff in the functions of the first and the second radio frequency in the capacitively coupled apparatus of a dual frequency application type (wherein two radio frequency powers are applied to an electrode) with the above-described configurations and operations. Especially, the in-surface uniformity of processes can be improved by controlling the plasma density spatial distribution characteristics while preventing or suppressing an undesired film from being formed on the other electrode facing the electrode to which two radio frequency powers are applied.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings.

Figure 1:
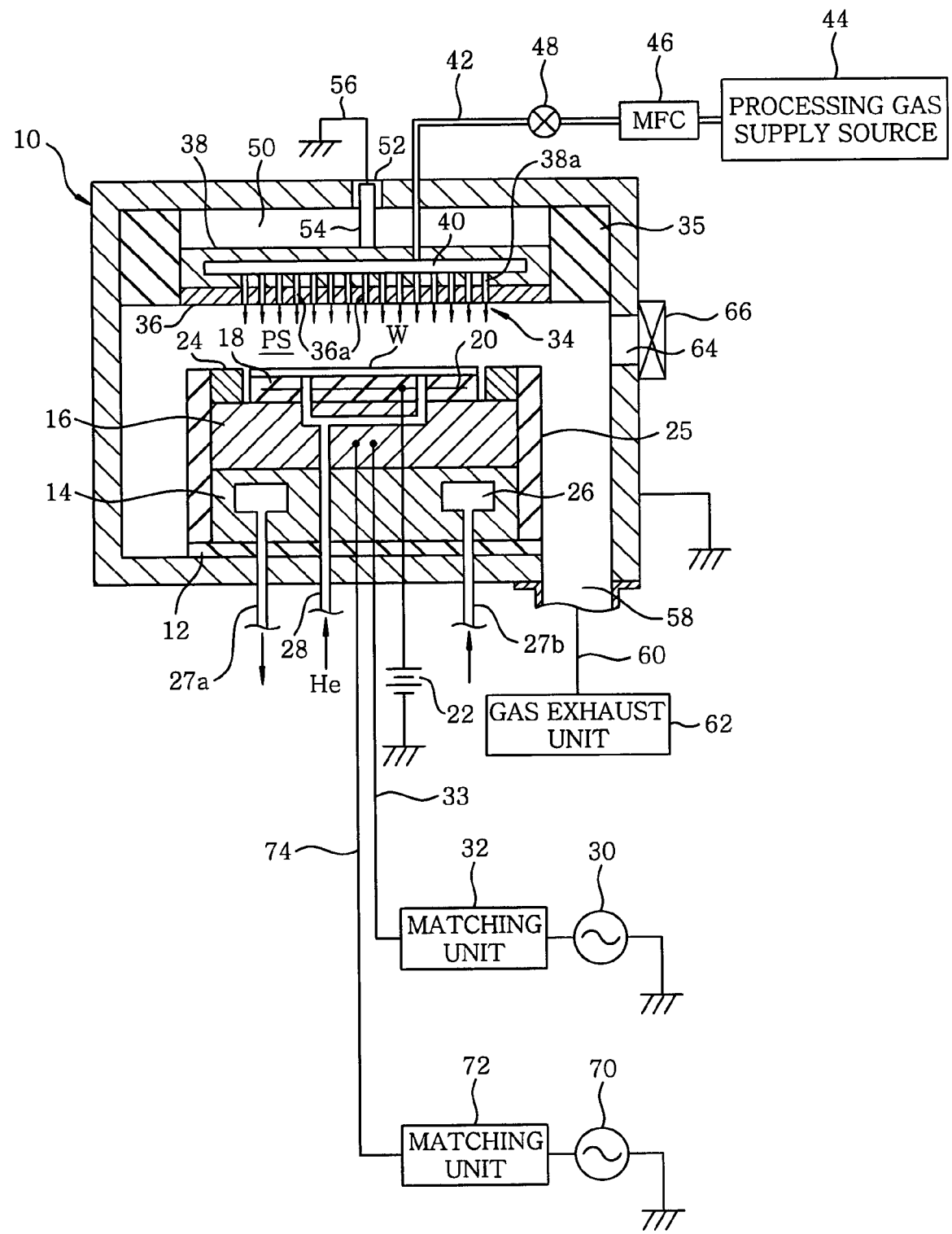
FIG. 1 is a vertical cross sectional view of a plasma etching apparatus in accordance with a first embodiment of the present invention.

FIG. 1 illustrates a configuration of a plasma processing apparatus in accordance with a first embodiment of the present invention. The plasma processing apparatus is configured as a capacitively coupled (parallel plate type) plasma processing apparatus of a type in which dual frequency powers are applied to a lower electrode. The plasma processing apparatus has a cylindrical vacuum chamber (processing chamber) 10 made of, e.g., an aluminum whose surface is alumite-treated (anodically oxidized), and the chamber 10 is frame grounded.

A cylindrical susceptor support 14 is provided at a bottom portion in the chamber 10 via an insulation plate 12 made of ceramic or the like. Further, a susceptor 16 made of, e.g., aluminum, is disposed above the susceptor support 14. The susceptor 16 serves as a lower electrode and a target substrate, e.g., a semiconductor wafer W, is mounted thereon.

On the top surface of the susceptor 16, there is disposed an electrostatic chuck 18 for attracting and holding the semiconductor wafer with an electrostatic adsorptive force. The electrostatic chuck 18 includes an electrode 20 formed of a conductive film which is inserted between a pair of insulating layers or sheets. A DC power supply 22 is connected to the electrode 20. The electrostatic chuck 18 is allowed to attract and hold the semiconductor wafer W thereon with a Coulomb force generated by a DC voltage applied from the DC power supply 22 thereto. A focus ring 24 made of, e.g., silicon is disposed to surround the electrostatic chuck 18 to improve an etching uniformity. Further, an inner wall member 25 made of, e.g., quartz is attached to the side surfaces of the susceptor 16 and the susceptor support 14.

A coolant path 26 is circumferentially provided inside the susceptor support 14. A coolant, e.g., cooling water, of a specific temperature is supplied into and circulated along the coolant path 26 from an external chiller unit (not shown) via coolant lines 27a, 27b. Accordingly, the processing temperature of the semiconductor wafer W on the susceptor 16 can be controlled by the temperature of the coolant. Further, a thermally conductive gas, e.g., He gas, is supplied into a gap between the top surface of the electrostatic chuck and the backside of the semiconductor wafer W from a thermally conductive gas supply unit (not shown) via a gas supply line 28.

The susceptor 16 is electrically connected with a first and a second radio frequency power supply 30 and 70 via matching units 32 and 72 and power feed rods 33 and 74, respectively. The first radio frequency power supply 30 outputs a radio frequency power of a specific frequency, e.g., 40 MHz, for plasma generation. Meanwhile, the second radio frequency power supply 70 outputs a radio frequency power of a specific frequency, e.g., 2 MHz, which mainly contributes to ion attraction toward the semiconductor wafer W on the susceptor and to prevention of an adhesion of an undesired film such as a deposited film, an oxide film or the like to an upper electrode 34 and removal of the undesired film which will be described later.

The upper electrode 34 is provided above the susceptor 16 to face the susceptor 16 in parallel. Further, the upper electrode 34 has an electrode plate 36 having a plurality of gas injection openings 36a and an electrode support 38 for detachably holding the electrode plate 36, the electrode plate 36 being made of a semiconductor material, e.g., Si, SiC or the like, the electrode support 38 being made of a conductive material, e.g., aluminum whose surface is alumite-treated. The upper electrode 34 is attached in an electrically floating state to the chamber 10 via a ring-shaped insulator 35. A plasma generation space or a processing space PS is defined by the upper electrode 34, the susceptor 16 and the sidewall of the chamber 10. The ring-shaped insulator 35, which is made of, e.g., alumina ($Al_2O_3$), is attached so that a gap between an outer peripheral surface of the upper electrode 34 and the sidewall of the chamber 10 can be airtightly sealed. The ring-shaped insulator 35 physically holds the upper electrode 34 and electrically forms a part of capacitance between the upper electrode 34 and the chamber 10.

The electrode support 38 has therein a gas buffer space 40 and also has on its bottom surface a plurality of gas ventholes 38a extending from the gas buffer space 40 to communicate with the gas injection openings 36a of the electrode plate 36. The gas buffer space 40 is connected with a processing gas supply source 44 via a gas supply line 42, and a mass flow controller MFC 46 and an opening/closing valve 48 are provided in the gas supply line 42. When a specific processing gas is introduced from the processing gas supply source 44 into the gas buffer space 40, the processing gas is injected into the processing space PS toward the semiconductor wafer W on the susceptor 16 in a shower shape from the gas injection openings 36a of the electrode plate 36. So, the upper electrode 34 also serves as a shower head for supplying a processing gas into the processing space PS.

Further, the electrode support 38 has therein a passageway (not shown) through which a coolant, e.g., cooling water, flows, so that a temperature of the entire upper electrode 34, particularly the electrode plate 36, can be controlled to a specific level with the coolant supplied from an external chiller unit. In order to further stabilize the temperature control of the upper electrode 34, a heater (not shown) including, e.g., a resistance heating element may be attached to an inside or a top surface of the electrode support 39.

A hollow space or gap 50 is provided between the top surface of the upper electrode 34 and the ceiling of the chamber 10. Further, a through-hole 52 is formed in a central portion of the top surface of the chamber 10, and a rod-shaped inductor 54 is vertically extended in the gap 50 and the through-hole 52. The rod-shaped inductor 54 has a lower end directly connected with the central portion of the top surface of the upper electrode 34 and an upper end connected with a ground potential (generally, the chamber 10) via a conducting wire. Alternatively, the upper end of the rod-shaped inductor 54 may be directly connected to the ceiling of the upper electrode 34.

An annular space defined by the susceptor 16, the susceptor support 14 and the sidewall of the chamber 10 serves as a gas exhaust space. A gas exhaust port 58 of the chamber 10 is provided at a bottom of the gas exhaust space. A gas exhaust unit 62 is connected with the gas exhaust port 58 via a gas exhaust line 60. The gas exhaust unit 62 has a vacuum pump such as a turbo molecular pump or the like, so that the inside of the chamber 10, especially the processing space PS, can be depressurized to a required vacuum level. Moreover, attached to the sidewall of the chamber 10 is a gate valve 66 for opening and closing a loading/unloading port 64 for the semiconductor wafer W.

In the plasma etching apparatus, in order to perform an etching process, the gate valve 66 is opened and a semiconductor wafer W to be processed is loaded into the chamber 10 to be mounted on the electrostatic chuck 18. Then, a specific processing gas, i.e., an etching gas (generally, a gaseous mixture) is supplied into the chamber 10 from the processing gas supply source 44 at a specified flow rate and flow rate ratio, while the chamber 10 is evacuated by the gas exhaust unit 62 such that the internal pressure of the chamber 10 is maintained at a specific vacuum level. Further, a first radio frequency power (about 2 MHz) and a second radio frequency power (about 40 MHz) are concurrently applied to the susceptor 16 from the first and the second radio frequency power supply 30, 70, respectively. Further, a DC voltage is applied to the electrode 20 of the electrostatic chuck 18 from the DC power supply 46, whereby the semiconductor wafer W is firmly fixed on the electrostatic chuck 18. The etching gas injected from the upper electrode 34 as the shower head is converted into a plasma by a radio frequency discharge in the plasma space PS, and films formed on the main surface of the semiconductor wafer W are etched by radicals or ions present in the plasma.

In such a capacitively coupled plasma etching apparatus, by applying to the susceptor (lower electrode) 16 a first radio frequency power of a relatively radio frequency, e.g., 40 MHz, suitable for plasma generation, a high-density plasma in a desirable dissociated state can be generated even at a low pressure. Also, by applying to the susceptor 16 a second radio frequency power of a relatively low frequency, e.g., 2 MHz, suitable for ion attraction, it is possible to perform an anisotropic etching having high selectivity to the semiconductor wafer W on the electrostatic chuck 18. Further, it is also possible to remove a deposited film or an oxide film on the upper electrode 34 (electrode surface cleaning) by the ions incident thereon or the sputtering.

Hereinafter, features of the plasma etching apparatus in accordance with the first embodiment of the present invention will be described with reference to FIGS. 2 to 4. For convenience, the second radio frequency power 70 that is substantially not related to the plasma generation and the control of a plasma spatial distribution is omitted in FIGS. 2 and 3.

As described above, in the plasma etching apparatus, the upper electrode 34 is attached to the chamber 10 via the ring-shaped insulator 35 and the rod-shaped inductor 54 is connected between the upper electrode 34 and the ground potential. In other words, if the inductor 54 is detached, the upper electrode 34 is installed inside the processing chamber 10 in a DC-floating state.

First of all, as for a comparative example, there will be described a case where the upper electrode 34 is directly attached to the chamber 10 to be DC-connected with the ground potential, for example. In this case, as shown in FIG. 2, when the first radio frequency power from the radio frequency power supply 30 is applied to the susceptor 16, a plasma of the processing gas is generated in the processing space PS by a radio frequency discharge between the susceptor 16 and the upper electrode 34 and that between the susceptor 16 and the sidewall of the chamber 10. The plasma thus generated is diffused in all directions, especially in upward and radially outward directions. Electron current in the plasma flows toward the ground via the upper electrode 34, the sidewall of the chamber 10 or the like. In the susceptor 16, as the frequency of the first radio frequency power increases, a radio frequency current is likely to be gathered at the central portion of the susceptor due to skin effect and the susceptor 16 is closer to the upper electrode 34 than the sidewall of the chamber 10, the upper electrode 34 and the sidewall of the chamber 10 having a same potential (ground potential). Accordingly, a larger amount of radio frequency power is discharged from the central portion of the electrode toward the processing space PS. Thus, most of the plasma electron current flows in the upper electrode 34, especially in the central portion thereof, while a considerably small part of the plasma electron current flows in the sidewall of the chamber 10. As a result, the plasma density spatial distribution in the central portion of the electrode is highest and significantly different from that in the edge portion of the electrode.

Figure 3:
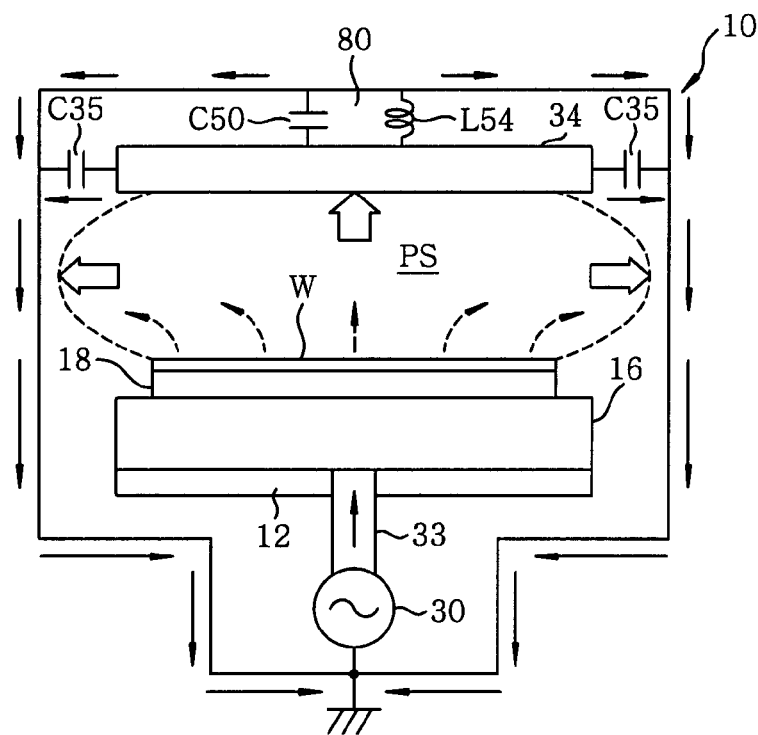
FIG. 3 schematically illustrates a capacitively coupled radio frequency discharge system in the plasma etching apparatus shown in FIG. 1.

In contrast, in the embodiment of the present invention in which the upper electrode 34 is attached to the chamber 10 in a DC-floating state and connected with the ground potential via the rod-shaped inductor 54, an equivalent circuit for a radio frequency transmission line from a boundary surface between the processing space PS and the upper electrode 34 to the ground potential via the upper electrode 34 is represented by a circuit including a coil $L_{54}$ arranged parallel to capacitors $C_{35}$ and $C_{50}$ as shown in FIG. 3. The coil $L_{54}$ is an inductance of the rod-shaped inductor 5 and 4 and specifically, the coil $L_{54}$ is connected in series with a resistance (not illustrated) of the rod-shaped inductor 54. The capacitor $C_{35}$ is a capacitance between the upper electrode 34 and the sidewall of the chamber 10 and mainly formed by the ring-shaped insulator 35. The capacitor $C_{50}$ is a capacitance between the upper electrode 34 and the ceiling of the chamber 10 and mainly formed by air in the gap 50.

Figure 2:
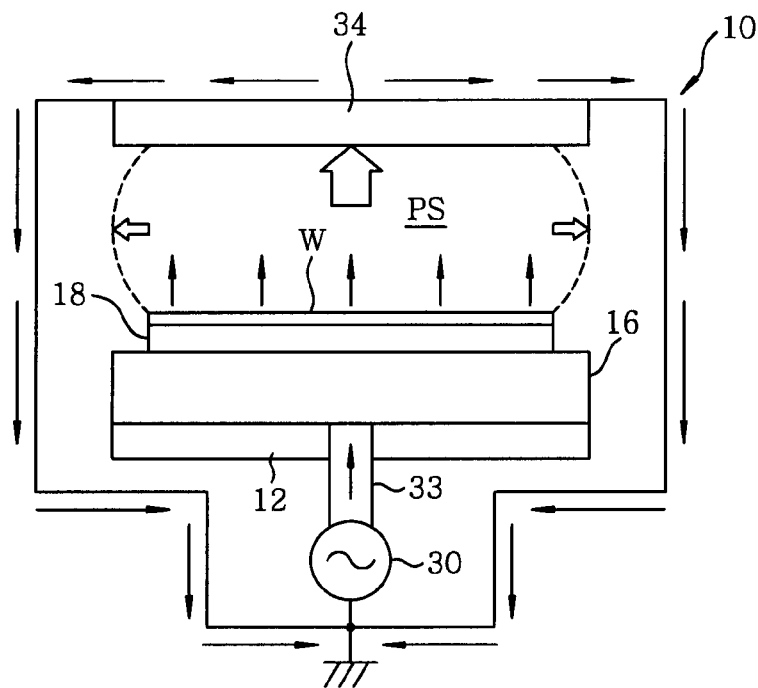
FIG. 2 schematically shows a capacitively coupled radio frequency discharge system in a plasma etching apparatus of a comparative example.

In this case as well, as similarly to the case shown in FIG. 2, when the first radio frequency power from the radio frequency power supply 30 is applied to the susceptor 16, the plasma of the processing gas is generated in the processing space PS by a radio frequency discharge between the susceptor 16 and the upper electrode 34 and that between the susceptor 16 and the sidewall of the chamber 10. The plasma thus generated is diffused in upward and radially outward directions, and an electron current in the plasma flows toward the ground via the upper electrode 34, the sidewall of the chamber 10 or the like. In the susceptor 16, a radio frequency current is likely to be gathered at the central portion of the susceptor. Also, the susceptor 16 is located closer to the upper electrode 34 than the sidewall of the chamber 10. However, a parallel LC circuit 80 including the coil $L_{54}$ and the capacitors $C_{35}$ and $C_{50}$ is provided between the upper electrode 34 and the ground potential. Therefore, when the parallel LC circuit 80 provides a high impedance Z against the first radio frequency power, the radio frequency current hardly flows in the upper electrode 34 disposed directly above the susceptor 16 even though it is gathered at the central portion of the susceptor 16. Accordingly, a relatively increased part of the plasma electron current flows in the sidewall of the chamber 10, which makes the plasma density distribution widen radially. Theoretically, depending on the impedance Z of the parallel LC circuit 80, it is possible to control a ratio of the electron current flowing between the susceptor 16 and the upper electrode 34 and that flowing between the susceptor 16 and the sidewall of the chamber 10 and further to control the plasma density spatial distribution characteristics to be uniform in a diametric direction.

Figure 4:
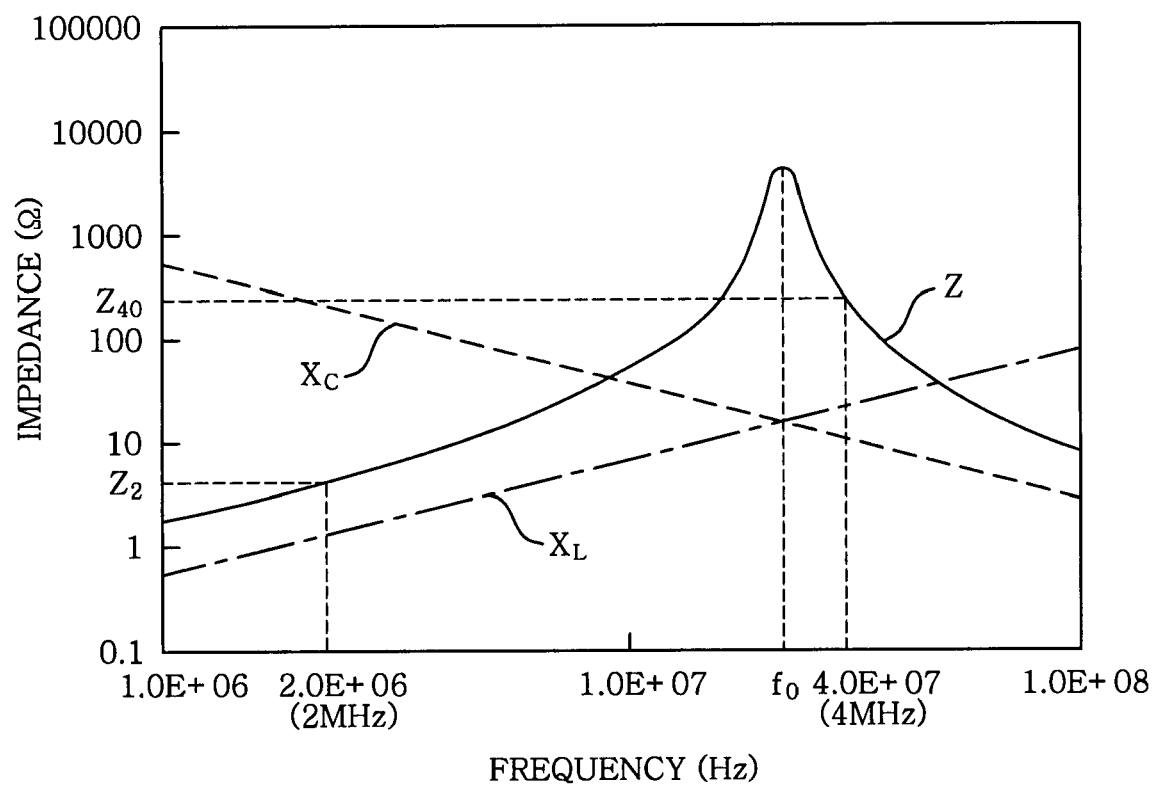
FIG. 4 describes an example of frequency-impedance characteristics in a radio frequency transmission line to a ground potential via an upper electrode in the plasma etching apparatus shown in FIG. 1.

FIG. 4 describes an example of frequency-impedance characteristics for a radio frequency transmission line from the boundary surface between the processing space PS and the upper electrode 34 to the ground potential via the upper electrode in the plasma etching apparatus. In FIG. 4, an impedance $X_L$ that gradually increases with respect to the frequency is an organic reactance $|j\omega L_{54}|$ of the coil $L_{54}$, and an impedance $X_C$ that gradually decreases with respect to the frequency is a capacitive reactance $|1/j\omega(C_{35}+C_{50})|$ of the capacitors $C_{35}$ and $C_{50}$. Theoretically, the parallel LC circuit 80 causes a parallel resonance or an antiresonance at a frequency where the organic reactance $X_L$ becomes equal (absolute value) to the capacitive reactance $X_C$. Further, as shown in FIG. 4, an impedance Z of the parallel LC circuit 80 has a maximum peak value at the antiresonance frequency $f_0$. It is preferable that the antiresonance frequency $f_0$ appears within a range including the frequency of the first radio frequency power (preferably, from 5 MHz to 200 MHz).

Accordingly, as illustrated in FIG. 4, by selecting or setting a variable or selectable parameter, i.e., an inductance of the inductor 54 such that the antiresonance frequency $f_0$ appears near (preferably, at) the frequency (40 MHz) of the first radio frequency power, a high value $Z_{40}$ can be selected as the impedance Z of the parallel LC circuit 80 for the first radio frequency.

Further, as shown in FIG. 4, it is important that an impedance $Z_{80}$ of the parallel LC circuit 80 for the second radio frequency can be set to be a value $Z_2$ significantly smaller than the value $Z_{40}$ for the first radio frequency by setting the antiresonance frequency $f_0$ within the range from 5 MHz to 200 MHz. In other words, the upper electrode 34 can be grounded at a low impedance for the second radio frequency. As a consequence, the ions in the plasma which vibrate due to the second radio frequency are incident on the electrode plate 36 of the upper electrode 34 with a strong impact, thereby sputtering (removing) a deposited film or an oxide film attached on the surface of the electrode plate 36.

Figure 5A:
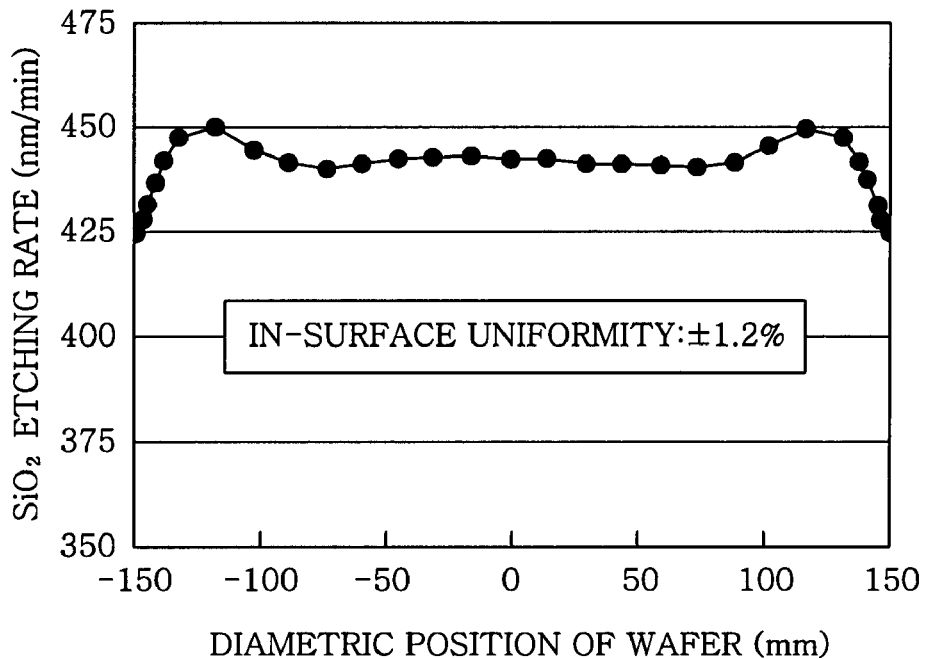
FIG. 5A depicts in-surface distribution characteristics of an etching rate of an oxide film in a test example in accordance with the present invention.
Figure 5B:
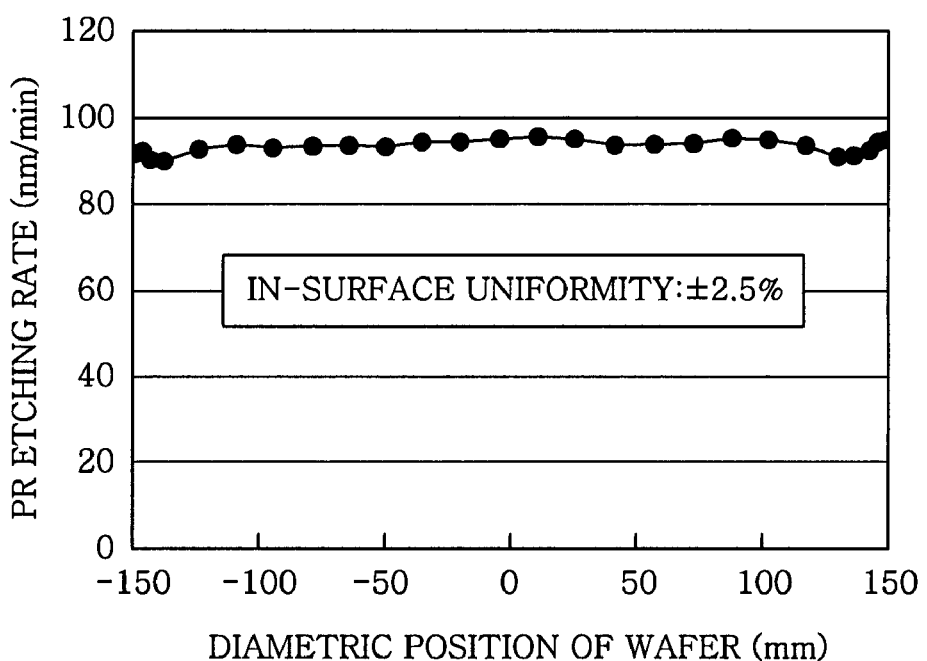
FIG. 5B presents in-surface distribution characteristics of an etching rate of a photoresist in the test example.
Figure 6A:
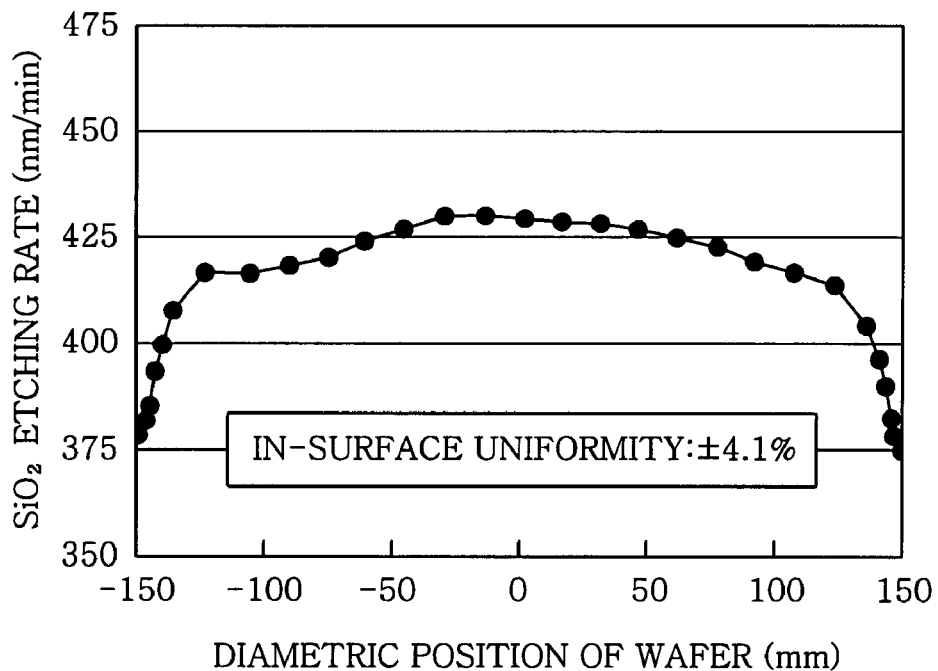
FIG. 6A represents in-surface distribution characteristics of an etching rate of an oxide film in a first comparative example.
Figure 6B:
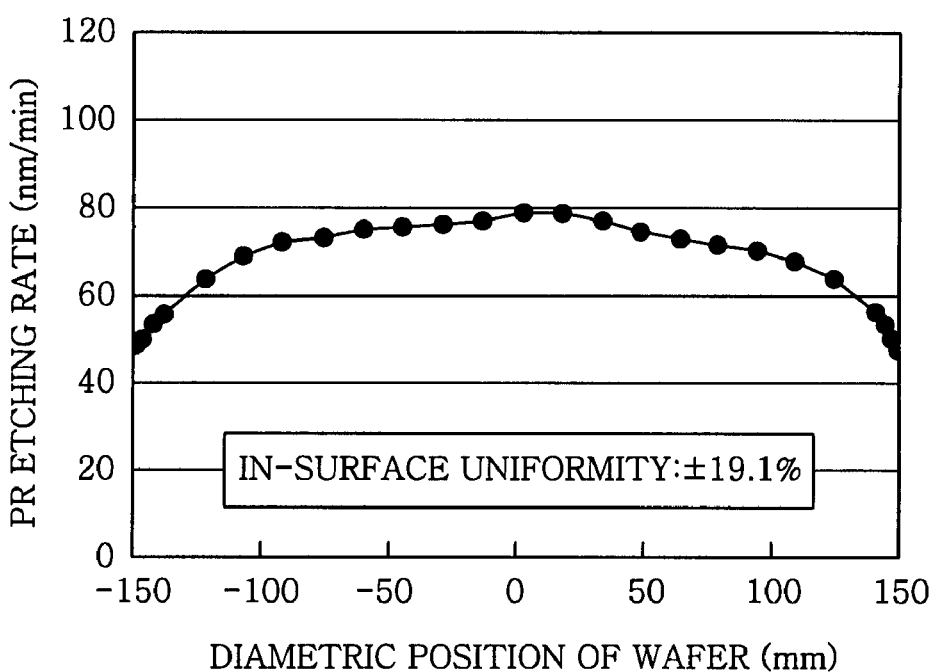
FIG. 6B describes in-surface distribution characteristics of an etching rate of a photoresist in the first comparative example.

FIGS. 5A and 5B illustrate, as a test example, in-surface distribution characteristics of etching rates of an oxide film $SiO_2$ and a photoresist PR by using the plasma etching apparatus of the first embodiment, respectively. In this test example, an inductance of the inductor 54 is set to be about 400 nH and a combined capacitance of the capacitors $C_{35}$ and $C_{50}$ is set to be about 250 pF (low capacitance). Meanwhile, FIGS. 6A, 6B and 7A, 7B present comparative examples. Referring to FIGS. 6A and 6B, there are illustrated, as a first comparative example, spatial distribution characteristics of the etching rates of the oxide film and the photoresist, respectively. In the first comparative example, the inductor 54 is omitted and a combined capacitance of the capacitors $C_{35}$ and $C_{50}$ is set to be about 20000 pH (high capacitance). Further, referring to FIGS. 7A and 7B, there are illustrated, as a second comparative example, spatial distribution characteristics of the etching rates of the oxide film and the PR, respectively. In the second comparative example, the inductor 54 is omitted and a combined capacitance of the capacitors $C_{35}$ and $C_{50}$ is set to be about 250 pH (low capacitance). The test example and the comparative examples have the following common etching conditions.

Wafer diameter: 300 mm
Flow rates of processing gases:

$C_4F_6/C_4F_8/Ar/O_2=40/20/500/60$ sccm

Pressure in chamber: 30 mTorr
Radio frequency power: 40 MHz/2 MHz=2500/3200 W
Temperature of upper electrode: 60° C.

As can be seen from FIGS. 6A and 6B, in the first comparative example where the inductor 54 is omitted and a ground capacitance of the upper electrode 34 is set to be a high capacitance of about 20000 pF, the etching rates of the oxide film and the PR are relatively uniform in a central portion of the wafer. However, the etching rates thereof abruptly decrease near an edge portion of the wafer (R=±120 mm), which results in poor in-surface uniformity of ±4.1% and ±19.1%.

Figure 7A:
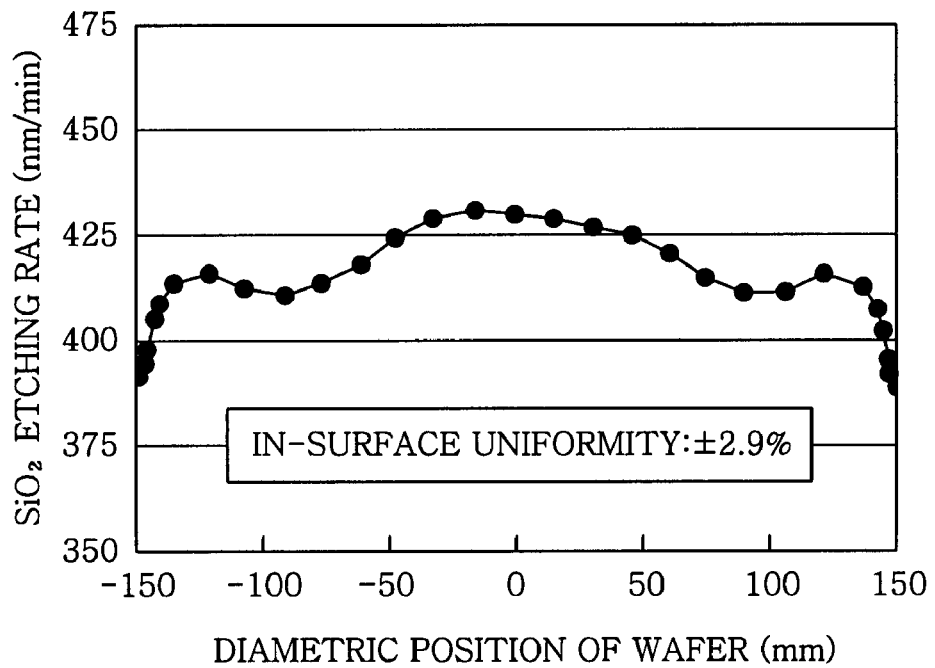
FIG. 7A offers in-surface distribution characteristics of an etching rate of an oxide film in a second comparative example.
Figure 7B:
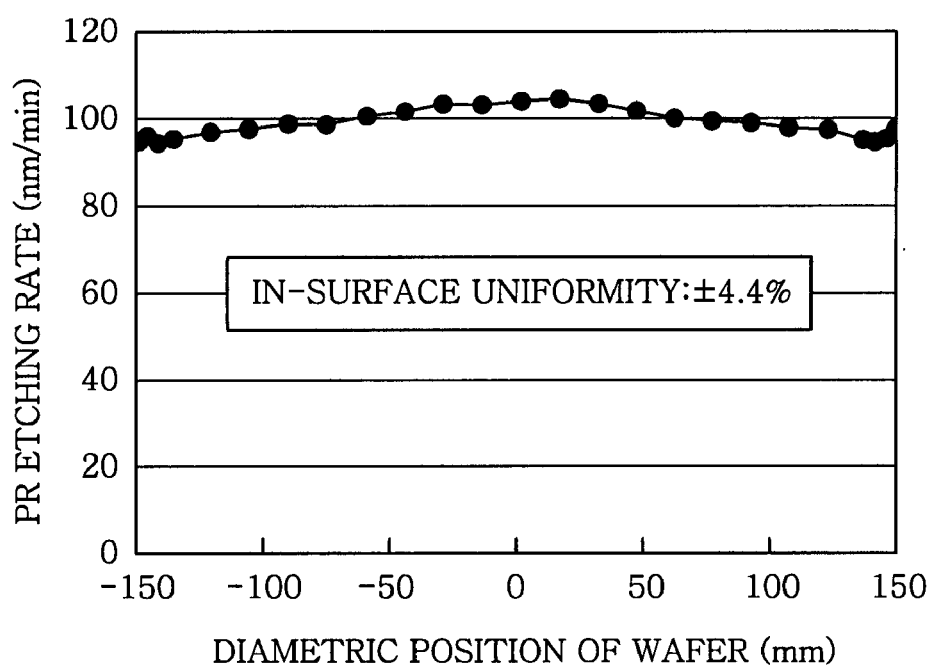
FIG. 7B provides in-surface distribution characteristics of an etching rate of a photoresist in the second comparative example.

Meanwhile, as shown in FIGS. 7A and 7B, the second comparative example where the inductor 54 is omitted and a ground capacitance of the upper electrode 34 is set to be a low capacitance of about 250 pF have significantly improved processing uniformity compared with the first comparative example. Specifically, the etching rate of the oxide film in the central portion of the wafer is substantially same as that of the first comparative example, and the etching rate of the oxide film in the edge portion of the wafer increases compared with that of the first comparative example, which leads to improved in-surface uniformity of ±2.4%. Moreover, the etching rate of the photoresist increases compared with that of the first comparative example and becomes uniform in each portion of the wafer, which results in improved in-surface uniformity of ±4.4%.

On the other hand, the test example has further improved processing uniformity compared with the second comparative example, as can be seen from FIGS. 5A and 5B. Specifically, the etching rate of the oxide film increases in each portion of the wafer, especially in the edge portion, compared with that of the second comparative example, which results in significantly improved in-surface uniformity of ±1.2%. Further, the etching rate of the photoresist is substantially uniform in each portion of the wafer, which leads to improved in-surface uniformity of ±2.5%.

In general, the etching rate distribution of the oxide film reflects an electron density distribution in plasma, i.e., a plasma density distribution. Further, the etching rate distribution of the photoresist is affected by a dissociation of an initial gas by the plasma and thus more strongly depends on the plasma density distribution. Therefore, as can be seen from the test result of FIGS. 5A and 5B, in accordance with the test example, the uniformity of the plasma density distribution is significantly improved by suppressing a concentration of the plasma generated in the processing space PS on the central portion of the electrode and broadening the plasma radially outwardly.

As described above, the plasma density distribution can be considerably improved in the second comparative example compared with the first comparative example. However, in the second comparative example in which the inductor 54 is not provided, the low-capacitance (250 pF) capacitors $C_{35}$ and $C_{50}$ forming the ground circuit of the upper electrode 34 provide a considerably great impedance to the second radio frequency (2 MHz) as well as the first radio frequency (40 MHz). More specifically, referring to FIG. 4 illustrating the frequency characteristics of the capacitive reactance $X_C$, the impedance at the first radio frequency (40 MHz) is higher than that at the second radio frequency (2 MHz). When the impedance of the ground circuit of the upper electrode 34 is high for the second radio frequency, the impact of ions incident on the upper electrode 34 due to the second radio frequency becomes weak, thereby deteriorating the sputtering effect.

To that end, in the test example, the inductor 54 is provided, so that an impedance of the parallel LC circuit 80 can be set to be high for the first radio frequency (40 MHz) and considerably low for the second radio frequency (2 MHz). Accordingly, the uniformity of the plasma density distribution can be significantly improved. Also, it is possible to maintain the impact intensity of ions incident on the upper electrode 34 and further the sputtering effect (electrode surface cleaning effects) sufficiently high.

As a result of measuring deposition rates of deposited films on a surface of the upper electrode 34 by using as an etching gas $C_4F_8$ gas generating a large amount of polymer in the test example and the second comparative example, the deposition rates of 80 nm/5 min and −100 nm/5 min were obtained in the test example and the second comparative example, respectively. In this measurement, the main etching conditions were as follows:

Flow rates of processing gases: $C_4F_6/Ar=5/1000$ sccm
Pressure in chamber: 40 mTorr
Radio frequency power: 40 MHz/2 MHz=2000/400 W
Temperature: upper electrode/chamber sidewall/lower electrode=150/150/40° C.
Etching time: 5 min Consequently, it has been found that the deposited film is accumulated on the surface of the upper electrode 34 in the second comparative example, whereas it is efficiently removed therefrom in the etching mode in the test example.

Figure 8:
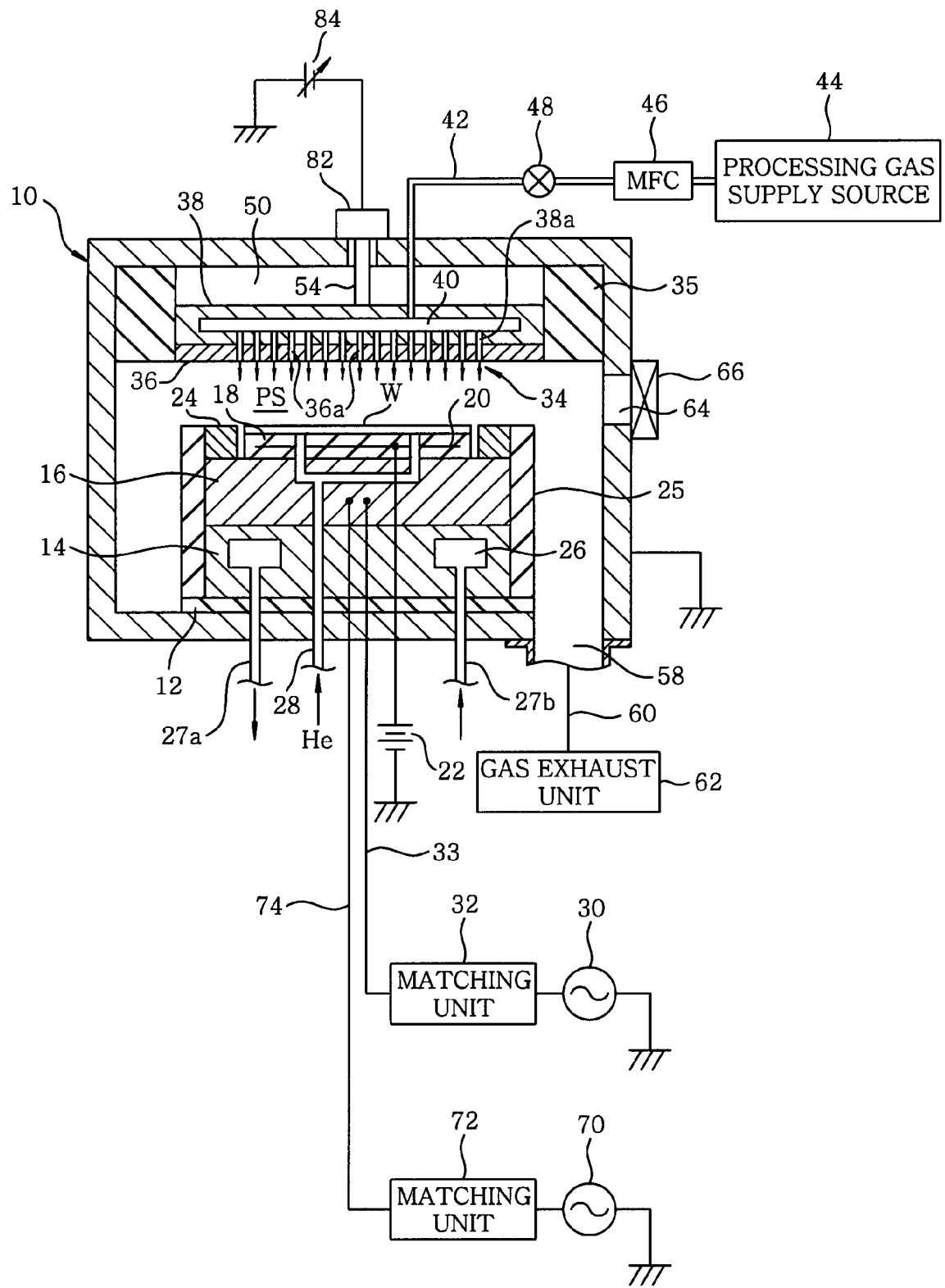
FIG. 8 illustrates a vertical cross sectional view of a plasma etching apparatus in accordance with a second embodiment of the present invention.

FIG. 8 illustrates a configuration of a plasma etching apparatus in accordance with a second embodiment of the present invention. The upper end of the inductor 54 is electrically connected with a variable DC power supply 84 via a DC filter unit 82 in the second embodiment, while it is grounded via the conducting wire 56 in the first embodiment. The configurations and functions of the other components of the second embodiment are same as those of the first embodiment.

Figure 9:
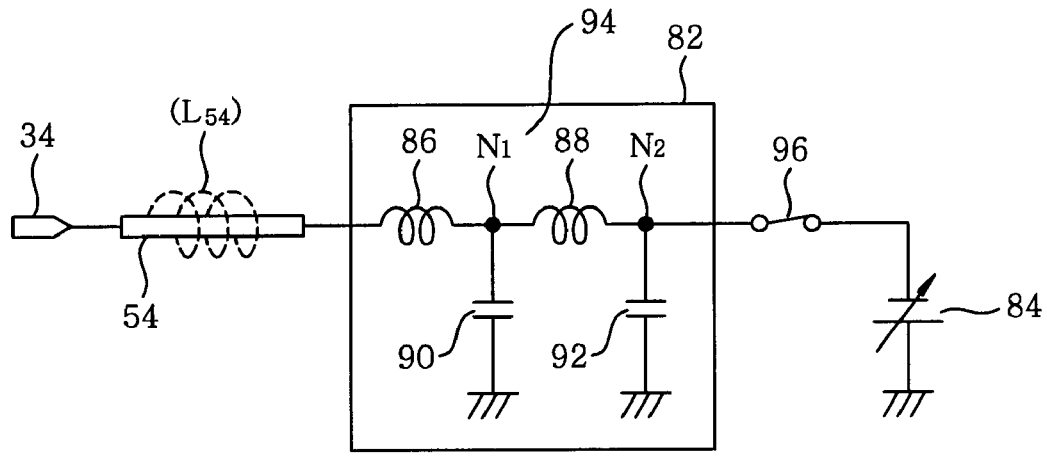
FIG. 9 is a circuit diagram showing an exemplary configuration of a circuit in a DC filter unit of the plasma etching apparatus.

FIG. 9 shows an exemplary circuit configuration in the DC filter unit 82. In the DC filter unit 82 of this embodiment, the inductor 54 is connected in series with two coils 86 and 88 in a DC transmission line from the variable DC power supply 84 to the upper electrode 34. Further, capacitors 90 and 92 are respectively connected between a node $N_1$ and a ground potential and between a node $N_2$ and the ground potential, wherein the node $N_1$ is provided between the coils 86 and 88 and the node $N_2$ is provided between the coil 88 and the variable DC power supply 84. A serial-parallel LC circuit 94 is formed by the coils 86 and 88 and the capacitors 90 and 92.

Moreover, the DC filter unit 82 may have therein a cooling (blowing) device such as a fan so as to maintain the temperatures of electrical components or devices in the DC filter unit 82 at appropriate levels. Although the DC filter unit 82 can be installed at any location between the inductor 54 and the variable DC power supply 84, it is preferable that the DC filter unit 82 is mounted on a ceiling (top surface) of the chamber 10.

A DC voltage outputted from the variable DC power supply 84 is applied to the upper electrode 34 via the coils 86 and 88 of the serial-parallel LC circuit 94 and the inductor 54. Meanwhile, when the first and the second radio frequency power applied from the respective radio frequency power supplies 30 and 70 to the susceptor 16 are introduced to the upper electrode 34 via the processing space PS, they flow to the ground via the inductor 54 and the serial-parallel LC circuit 94 in the DC filter unit 82 while hardly flowing to the variable DC power supply 84.

The variable DC power supply 84 is configured to output a DC voltage having a polarity and a voltage level selected depending on processing types or conditions. It has been known that, by applying a proper DC voltage to the upper electrode 34, at least one of following effects can be obtained: (1) sputtering effect (deposit removal effect) on the upper electrode 34 is enhanced by increasing an absolute value of a self-bias voltage of the upper electrode 34; (2) the generation amount of plasma is reduced by enlarging a plasma sheath with respect to the upper electrode 34; (3) electrons generated near the upper electrode 34 are irradiated onto a target substrate (semiconductor wafer W); (4) a plasma potential can be controlled; (5) electron density (plasma density) is increased; and (6) the plasma density in the central portion is increased. For a case where it is not required to apply a DC voltage to be applied to the upper electrode 34, it is preferable to provide an on/off switch 96 including, e.g., a relay switch between the variable DC power supply 84 and the serial-parallel LC circuit 94.

In the second embodiment, the serial-parallel LC circuit 94 in the DC filter unit 82 allows the DC voltage from the variable DC power supply 84 to flow therethrough to the upper electrode 34 and generates a serial resonance at a low frequency range (preferably, from 100 kHz to 15 MHz) and a parallel resonance at a radio frequency range (preferably, from 5 MHz to 200 MHz) with respect to the radio frequency from the upper electrode 34. By utilizing such frequency-impedance characteristics of the serial-parallel LC circuit 94, it is possible to further improve the individual functions of the first and the second radio frequency in the dual frequency application type wherein two radio frequency powers are applied to the lower electrode.

Figure 10:
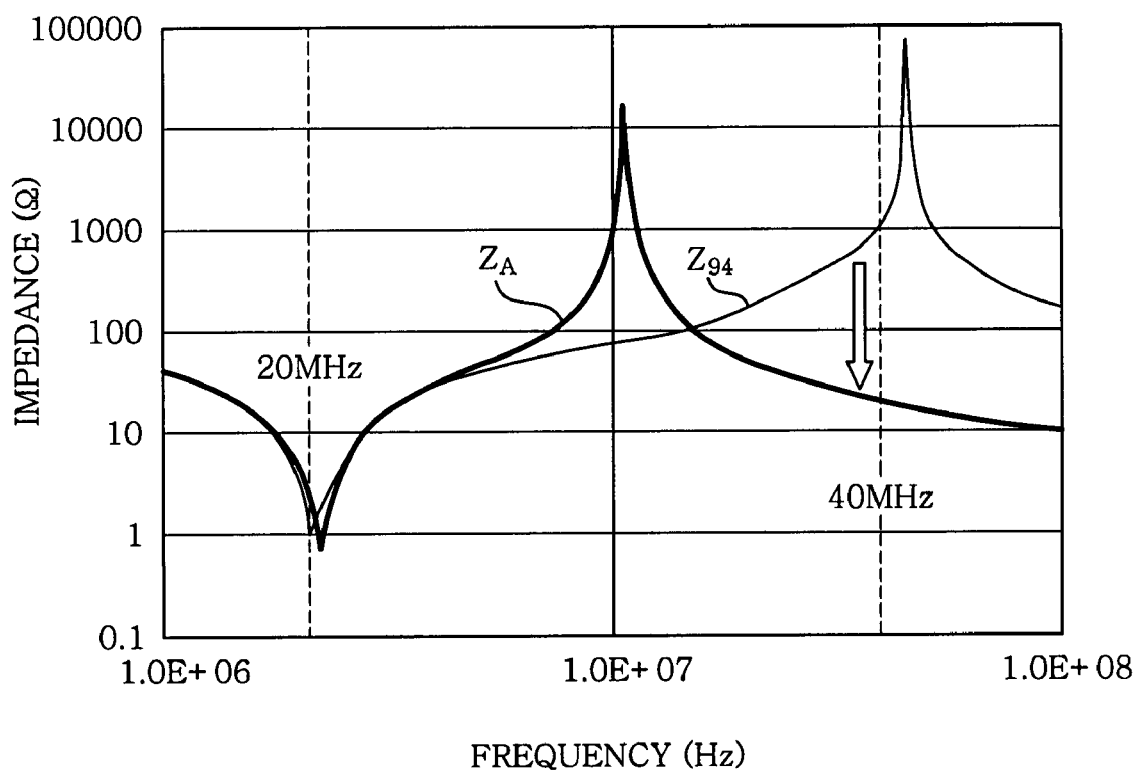
FIG. 10 depicts an example of frequency-impedance characteristics of a serial-parallel LC circuit in the DC filter unit and an example of frequency-impedance characteristics in a radio frequency transmission line to a ground potential via an upper electrode in the plasma etching apparatus shown in FIG. 2.

FIG. 10 depicts, as an example, frequency-impedance characteristics $Z_{94}$ of the serial-parallel LC circuit 94 alone in this embodiment and frequency-impedance characteristics $Z_A$ in a radio frequency transmission line from a boundary surface between the processing space PS and the upper electrode 34 to the ground potential via the upper electrode 34.

As shown in FIG. 10, in this example, a resonance frequency and an antiresonance frequency of the serial-parallel LC circuit 94 are set to be about 2 MHZ and about 45 MHZ, respectively. In the frequency-impedance characteristics $Z_{94}$, a considerably high impedance of about 1000Ω corresponds to the first radio frequency (40 MHz), whereas an extremely low impedance of about 1Ω corresponds to the second radio frequency (2 MHz). In the frequency-impedance characteristics $Z_A$ of the entire ground circuit around the upper electrode 34 wherein the inductor 54, the capacitors $C_{35}$, $C_{50}$ and the like are added to the serial-parallel LC circuit 94, the antiresonance frequency is shifted to the low frequency range up to about 10 MHz, whereas the resonance frequency is maintained near about 2 MHz. Further, while the impedance corresponding to the first radio frequency (40 MHZ) is considerably reduced to about 20Ω, the impedance corresponding to the second radio frequency (2 MHZ) is slightly reduced to about 0.7Ω, and the difference therebetween is still maintained more than 20 times.

A noticeable point in FIG. 10 is that the impedance corresponding to the second radio frequency (2 MHZ) in the frequency-impedance characteristics $Z_A$ of the entire ground circuit around the upper electrode 34 can be lowered to 1Ω or less by utilizing a resonance phenomenon of the serial-parallel LC circuit 94. As a consequence, the upper electrode 34 is seemingly short-circuited to the ground potential (imaginary short-circuit state) in view of the second radio frequency (2 MHz), which enhances the impact intensity of ions incident on the upper electrode 34 due to the vibrations of the second radio frequency and further the sputtering effect (deposit removal effect).

The frequency-impedance characteristics $Z_{94}$ and $Z_A$ shown in FIG. 10 are provided for illustrative purpose only and can be modified or adjusted by varying inductance values of the coils 86 and 88 and capacitance values of the capacitors 90 and 92 in the serial-parallel LC circuit 94.

Further, the circuit configuration shown in FIG. 9 is provided for illustrative purpose only, and a modification can be made in or around the DC filter unit 82. For example, in the serial-parallel LC circuit 94, the number of coils and capacitors may be changed, the circuit network may be formed in T type, π type or the like without being limited to that shown in FIG. 9. Besides, a circuit element having a different function, e.g., a noise removing coil (not shown) or the like, may be inserted between the serial-parallel LC circuit 94 and the variable DC power supply 84.

Figure 11:
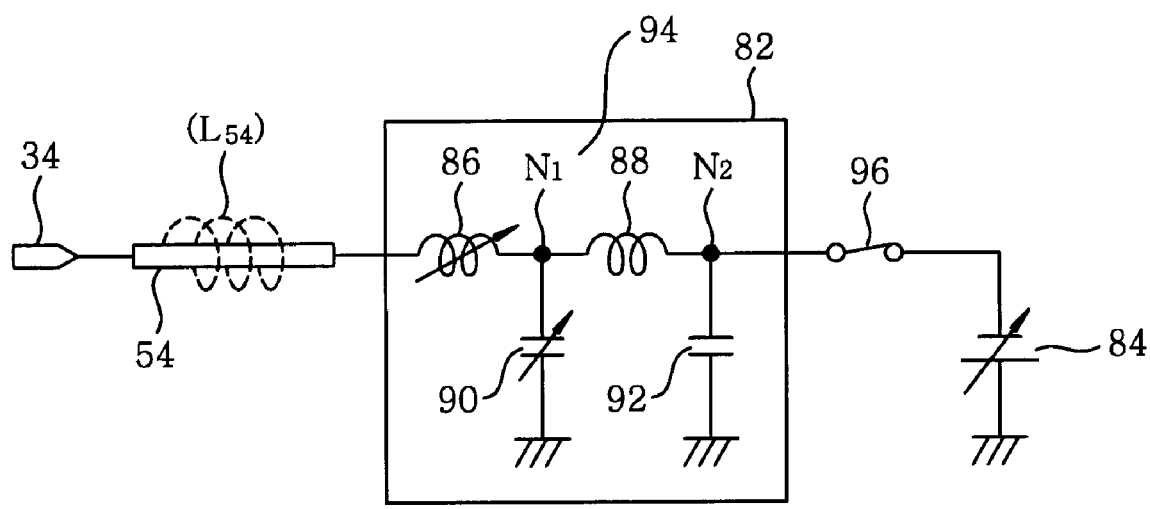
FIG. 11 shows a circuit diagram of a modified configuration of the circuit in the DC filter unit.

Moreover, a variable impedance element may be provided in the DC filter unit 82. For example, as shown in FIG. 11, the coil 86 and the capacitors 90 may be made to serve as a variable reactor and a variable capacitor, respectively.

Figure 12:
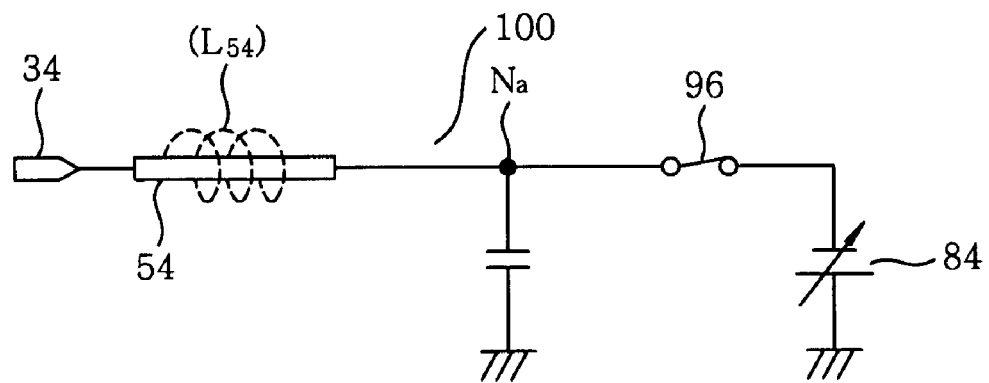
FIG. 12 sets forth a circuit diagram of a modification of the serial-parallel LC circuit in the second embodiment of the present invention.

Instead of the serial-parallel LC circuit 94, the upper electrode 34 may be grounded via a serial LC circuit 100 including the inductor 54 and a capacitor 98, as shown in FIG. 12. In this case, as an entire ground circuit around the upper electrode 34, i.e., as an equivalent circuit in a radio frequency transmission line from the boundary surface between the processing space PS and the upper electrode 34 to the ground potential via the upper electrode 34, there is formed a serial-parallel LC circuit (not shown) in which the capacitors $C_{35}$ and $C_{50}$ (see, FIG. 3) are connected with the serial LC circuit 100 in parallel. In the frequency-impedance characteristics of the serial-parallel LC circuit, as similar to that in FIG. 10, an inductance of the inductor 54 and a capacitance of the capacitor 98 is preferred to be set such that a desired resonance frequency and a desired antiresonance frequency higher than the resonance frequency are obtained in respective frequency ranges, and preferably such that the resonance frequency is obtained near the frequency of the second radio frequency power.

Further, in case the variable DC power supply 84 is used, an output terminal of the variable DC power supply 84 is preferably electrically connected with a node $N_a$ provided between the inductor 54 and the capacitor 98, as shown in FIG. 12. Moreover, the variable DC power supply 84 may be omitted. In such a case, the inductor 54 and the capacitor 98 may be exchanged with respect to the upper electrode 34. In other words, the capacitor 98 may be connected in series between the upper electrode 34 and the inductor 54. The inductor 54 is not limited to a rod-shaped conductor and may be formed of a coil-shaped conductor or any inductive element or member for providing a capacitive impedance.

Figure 13:
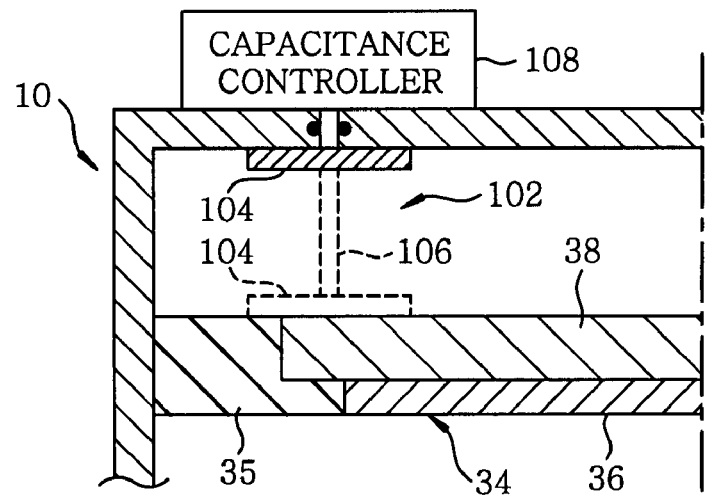
FIG. 13 describes a fragmentary cross sectional view of an example of a capacitance varying unit in the plasma etching apparatus in accordance with the second embodiment of the present invention.
Figure 14:
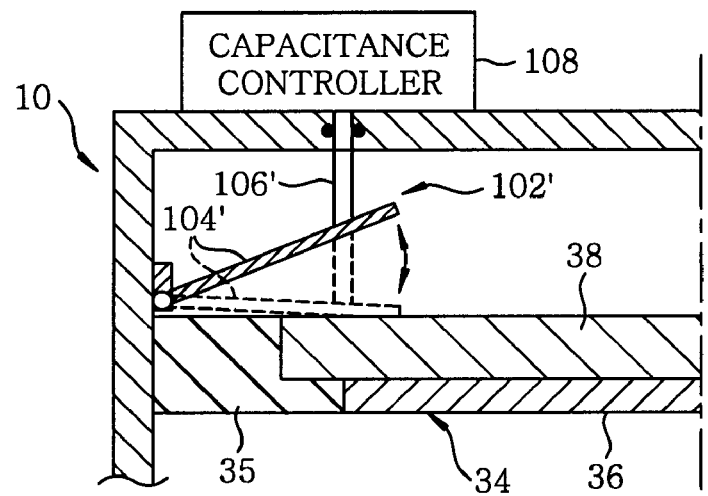
FIG. 14 offers a fragmentary cross sectional view of another example of the capacitance varying unit in the plasma etching apparatus in accordance with the second embodiment of the present invention.
Figure 15:
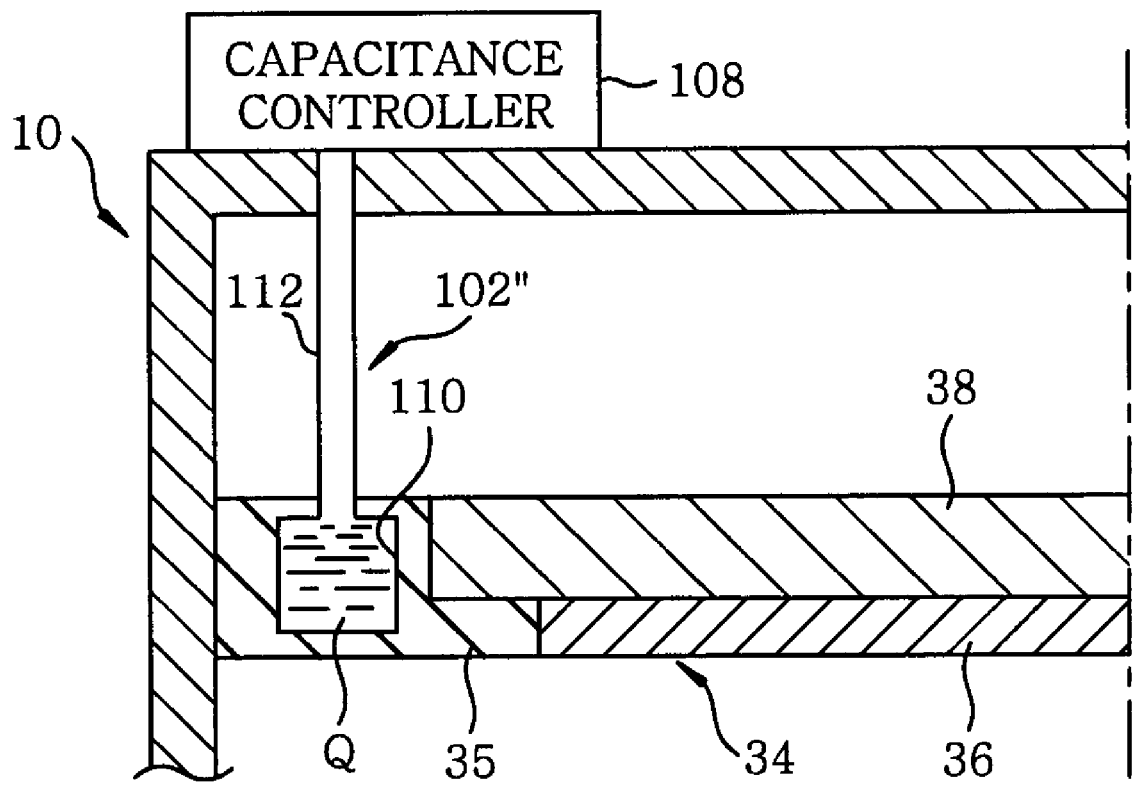
FIG. 15 presents a fragmentary cross sectional view of still another example of the capacitance varying unit in the plasma etching apparatus in accordance with the second embodiment of the present invention.

Further, it is possible to vary an electrostatic capacitance or a ground capacitance around the upper electrode 34 in the plasma etching apparatus of the above embodiments. FIGS. 13 to 15 show exemplary configurations of a capacitance varying unit.

Capacitance varying units 102 and 102' shown in FIGS. 13 and 14 respectively include conductive plates 104 and 104' movable between a first position where it contacts with or adjacent to a top surface of the upper electrode 34 and a second position upwardly spaced from the upper electrode 34; manipulating mechanisms 106 and 106' for vertically moving or displacing the conductive plates 104 and 104'; and a capacitance controller 108 for controlling a ground capacitance of the upper electrode 34 to a desired level by using the manipulating mechanisms 106 and 106'. The manipulating mechanism 106 of FIG. 13, which is grounded directly or via the chamber, is made of a conductive material, a material conductive to a radio frequency, or a material having a low impedance to a radio frequency. The manipulating mechanism 106' of FIG. 14 may be made of an insulating material. In such capacitance varying types, a ground capacitance of the upper electrode 34 can be varied depending on the height positions of the conductive plates 104 and 104'. The closer the conductive plates 104 and 104' are to the ceiling surface of the chamber 10, the smaller the ground capacitance of the upper electrode 34 becomes. On the contrary, the closer the conductive plates 104 and 104' are to the top surface of the upper electrode 34, the grater the ground capacitance of the upper electrode 34 becomes. To be extreme, it is possible to make the ground capacitance infinite by allowing the upper electrode 34 to be grounded via the conductive plates 104 and 104' contacted therewith.

A capacitance varying unit 102" shown in FIG. 15 includes an annular liquid chamber 110 formed in the ring-shaped insulator 35 provided between the upper electrode 34 and the sidewall of the chamber 10. A liquid Q having an appropriate dielectric constant (for example, an organic solvent such as Galden or the like) can be supplied from the outside of the chamber 10 into the liquid chamber 110 via a line 112 and removed therefrom. By changing the kind (dielectric constant) or the amount of the liquid Q, an electrostatic capacitance of the entire ring-shaped insulator 35 and further a ground capacitance of the upper electrode 34 can be varied.

Alternatively, a variable capacitor (not shown) may be connected between the upper electrode 34 and the chamber 10.

Any frequency-impedance characteristics can be realized by appropriately combining the variable capacitor, the capacitance varying unit 102, a variable inductance element (not shown) for varying an inductance of the inductor 54, the variable impedance element in the DC filter unit 82 shown in FIG. 11 and the like. More specifically, an impedance to the first radio frequency for plasma generation can be adjusted by the aforementioned variable capacitor or the capacitance varying unit 102, while an impedance to the second radio frequency for ion attraction can be adjusted by the variable impedance element in the DC filter unit 82.

Figure 16:
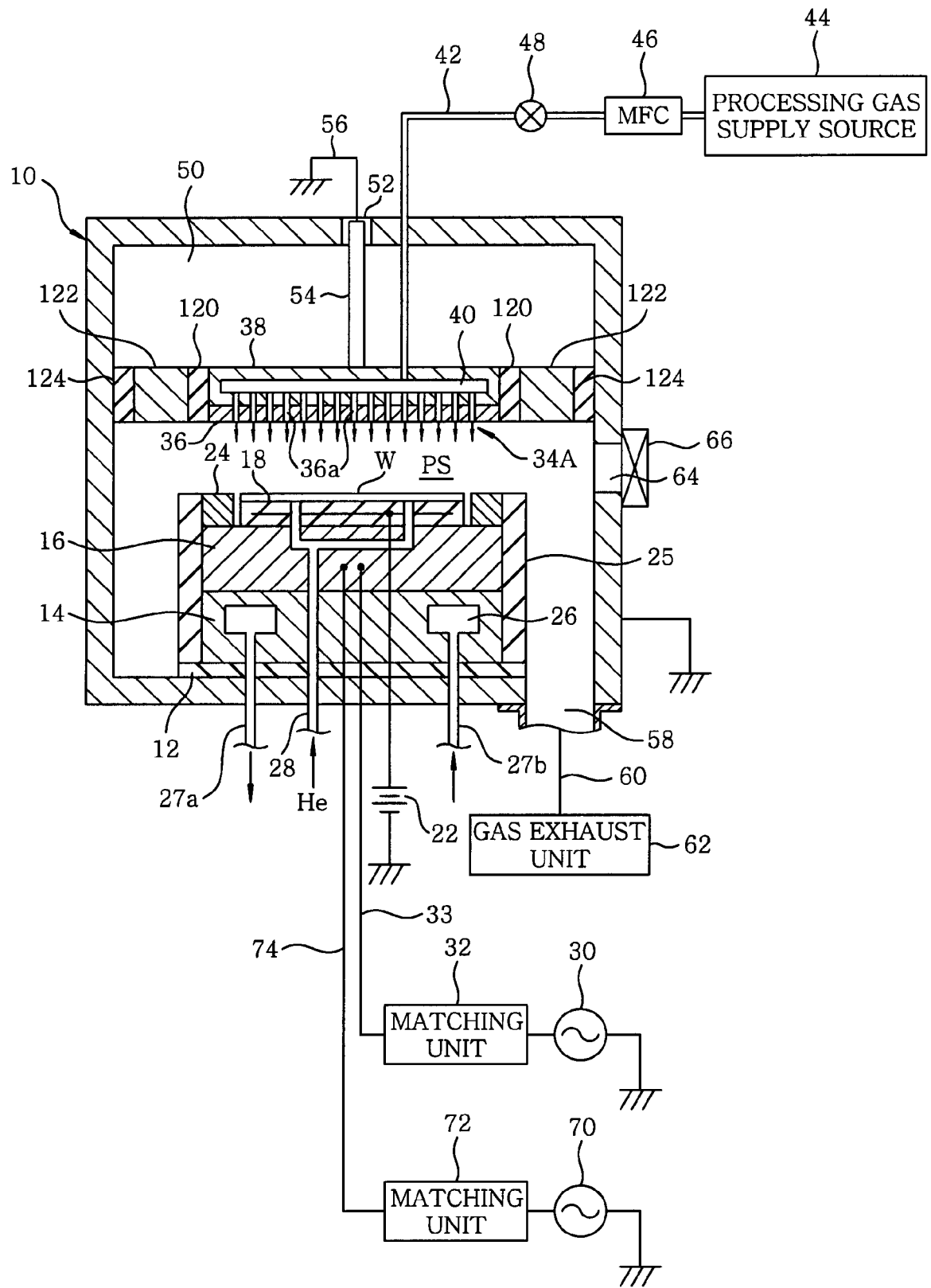
FIG. 16 represents a vertical cross sectional view of a plasma etching apparatus in accordance with a modification of the second embodiment of the present invention.

As another embodiment of the present invention, a configuration shown in FIG. 16 may be employed. Specifically, the first radio frequency power is supplied from the radio frequency power supply 30 to the susceptor 16 via the matching unit 32 and the power feed rod 33 while the second radio frequency power is supplied from the radio frequency power supply 70 to the susceptor 16 via the matching unit 72 and the power feed rod 74 (the type in which dual frequency powers are applied to the lower electrode). Further, the upper electrode is divided in a radial direction into a disk-shaped inner upper electrode 34A and a ring-shaped outer upper electrode 122. A ring-shaped insulator 120 is inserted between the inner upper electrode 34A and the outer upper electrode 122 and, also, a ring-shaped insulator 124 is inserted between the outer upper electrode 122 and the sidewall of the chamber 10. Such a configuration enables the first radio frequency power of a radio frequency to flow mainly in a path to the sidewall (earth) of the chamber 10 via the outer upper electrode 122 and the second radio frequency power of a low frequency to flow mainly in a path to the earth via the inner upper electrode 34A and the power feed rod 52.

The frequencies of the first and the second radio frequency power are used as illustrative purpose only in the above embodiments, and any frequency can be selected depending on processes. In general, the first radio frequency power for plasma generation has a frequency of about 13.56 MHz or greater, and the second radio frequency power for ion attraction to the substrate or the upper electrode has a frequency of about 13.56 MHz or less.

The ground circuit around the upper electrode 34 in the aforementioned embodiments has been described for illustrative purpose only, and various modifications can be made to configurations and functions of the components of the apparatus. Although the above embodiments have been described with respect to the plasma etching apparatus and method, but the present invention may be applied to other parallel plate type plasma processing apparatus and method such as plasma chemical vapor deposition (CVD), plasma oxidation, plasma nitridation, sputtering and the like. Further, the substrate to be processed is not limited to the semiconductor wafer, but it may be a flat panel display substrate, a photo mask, a compact disk (CD) substrate, a printed substrate or the like.

While the invention has been shown and described with respect to the embodiments, it will be understood by those skilled in the art that various changes and modification may be made without departing from the scope of the invention as defined in the following claims.

What is claimed is:
1. A plasma processing apparatus comprising:
an evacuable processing chamber which is grounded;
a first electrode attached to the processing chamber via an insulating material or a space;

a second electrode disposed in parallel with the first electrode space apart therefrom in the processing chamber, the second electrode supporting a target substrate to face the first electrode;

a first radio frequency power supply unit for applying a first radio frequency power of a first frequency to the second electrode;

a second radio frequency power supply unit for applying a second radio frequency power of a second frequency lower than the first frequency to the second electrode;

a processing gas supply unit for supplying a processing gas to a processing space formed by the first and the second electrode and a sidewall of the processing chamber;

a DC power supply for applying a DC voltage to the first electrode; and a filter electrically connected between the first electrode and the DC power supply, the filter allowing a direct current to substantially pass therethrough and having a resonance frequency associated with the second frequency and an antiresonance frequency associated with the first frequency.

2. The plasma processing apparatus of claim 1, wherein the filter has plural inductors electrically connected in series in a DC transmission line between the first electrode and the DC power supply; and respective capacitors connected between a ground potential and nodes provided in the DC transmission line.

3. The plasma processing apparatus of claim 1, wherein an impedance of the filter corresponding to the second frequency is lower than that corresponding to the first frequency.

4. The plasma processing apparatus of claim 3, wherein the resonance frequency is set within a range from about 100 kHz to about 15 MHz and the antiresonance frequency is set within a range from about 5 MHz to about 200 MHz.

5. The plasma processing apparatus of claim 4, wherein the resonance frequency is substantially equal or close to the second frequency.

6. The plasma processing apparatus of claim 1, wherein frequency-impedance characteristics of the filter are set to obtain desired plasma density distribution characteristics for a plasma generated in the processing space.

7. The plasma processing apparatus of claim 1, wherein the first frequency is about 27 MHz or greater.

8. The plasma processing apparatus of claim 7, wherein the first frequency is about 40 MHz or greater.

9. The plasma processing apparatus of claim 1, wherein the second frequency is about 13.56 MHz or less.

10. The plasma processing apparatus of claim 1, wherein the first and the second electrode serve as an upper electrode and a lower electrode, respectively.

11. The plasma processing apparatus of claim 10, wherein a gas chamber into which the processing gas from the processing gas supply unit is introduced is provided above or at an upper portion of the first electrode, and a plurality of gas injection openings for injecting the processing gas from the gas chamber into the processing space are formed in the first electrode.

12. The plasma processing apparatus of claim 1, wherein a ring-shaped insulator is airtightly provided between the first electrode and the sidewall of the processing chamber.

13. The plasma processing apparatus of claim 1, wherein the filter is set to enhance at the second frequency an impact intensity of ions from a plasma in the processing chamber on the first electrode.

14. The plasma processing apparatus of claim 1, wherein the filter connected to the DC power supply comprises variable reactance components.

15. The plasma processing apparatus of claim 1, wherein the filter connected to the DC power supply comprises a rf frequency transmission line.

* * * * *